US012787824B2

(12) United States Patent
Takaya et al.

(10) Patent No.: US 12,787,824 B2
(45) Date of Patent: Nov. 3, 2026

(54) SEMICONDUCTOR PACKAGE AND SEMICONDUCTOR ELECTRONIC DEVICE

(71) Applicant: KYOCERA Corporation, Kyoto (JP)

(72) Inventors: Shigenori Takaya, Kyoto (JP); Hironobu Fujiwara, Kyoto (JP); Emi Mukai, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 409 days.

(21) Appl. No.: 18/557,754

(22) PCT Filed: Apr. 26, 2022

(86) PCT No.: PCT/JP2022/018904

§ 371 (c)(1),
(2) Date: Oct. 27, 2023

(87) PCT Pub. No.: WO2022/230883

PCT Pub. Date: Nov. 3, 2022

(65) Prior Publication Data

US 2025/0079284 A1 Mar. 6, 2025

(30) Foreign Application Priority Data

Apr. 27, 2021 (JP) ................................ 2021-075421

(51) Int. Cl.
*H10W 70/65* (2026.01)
*H05K 1/11* (2006.01)
(Continued)

(52) U.S. Cl.
CPC ............ *H10W 70/65* (2026.01); *H05K 1/113* (2013.01); *H10W 70/68* (2026.01);
(Continued)

(58) Field of Classification Search
CPC ..... H10W 70/65; H10W 70/05; H10W 70/68; H10W 74/114; H10W 70/66;
(Continued)

(56) References Cited

U.S. PATENT DOCUMENTS

2010/0252313 A1 10/2010 Tsunjino
2015/0195935 A1 7/2015 Shibayama et al.
2017/0135204 A1 5/2017 Ding et al.

FOREIGN PATENT DOCUMENTS

JP 2006-066867 A 3/2006
JP 2009-010149 A 1/2009
(Continued)

*Primary Examiner* — Elias Ullah
(74) *Attorney, Agent, or Firm* — Volpe Koenig

(57) ABSTRACT

A semiconductor package includes: a base including a first surface including a first side and a second side coupled to the first side; a wiring laminate located on the first surface, extending along the first side of the first surface, and including a second surface extending along the second side; and a peripheral wall portion, together with the wiring laminate, surrounding the first surface. The wiring laminate includes a plurality of insulation layers laminated in a layered structure, at least two first wiring conductors located on different insulation layers of the plurality of insulation layers, and an interlayer conductor located on a side surface and coupling the at least two first wiring conductors to each other.

12 Claims, 6 Drawing Sheets

(51) Int. Cl.

| | |
|---|---|
| ***H10W 70/68*** | (2026.01) |
| ***H10W 70/685*** | (2026.01) |
| ***H10W 76/12*** | (2026.01) |

(52) U.S. Cl.

CPC ......... *H10W 70/685* (2026.01); *H10W 76/12* (2026.01); *H05K 2201/09227* (2013.01); *H05K 2201/09236* (2013.01); *H05K 2201/09263* (2013.01); *H05K 2201/093* (2013.01)

(58) Field of Classification Search

CPC ......... G06K 19/0723; G06K 19/07749; G06K 19/07754; B32B 2255/205; B32B 2307/202; B32B 2457/08; B32B 5/022; B32B 5/266; B32B 7/12; A61F 5/44; H05K 1/02; G01N 27/02

See application file for complete search history.

(56) References Cited

FOREIGN PATENT DOCUMENTS

| | | | |
|---|---|---|---|
| JP | 2018046266 | A | 3/2018 |
| WO | 2009/057691 | A1 | 5/2009 |
| WO | 2014/069123 | A1 | 5/2014 |

SEMICONDUCTOR PACKAGE AND SEMICONDUCTOR ELECTRONIC DEVICE

TECHNICAL FIELD

The present disclosure relates to a semiconductor package and a semiconductor electronic device.

BACKGROUND OF INVENTION

A conventional semiconductor package contains an electronic component and electrically couples the electronic component to an external substrate or the like. Such a semiconductor package includes conductor lines for coupling the coupling terminals of the electronic component to the outside of the semiconductor package. In U.S. Patent Application Publication No. 2017/0135204, via hole conductors for coupling conductor lines on different insulation layers are collectively arranged in an end portion of a substrate so as to couple upper and lower conductor lines on layers on both sides of an RF signal layer and a ground layer.

SUMMARY

Solution to Problem

An aspect of the present disclosure is
a semiconductor package including:
- a base comprising a first surface comprising a first side and a second side coupled to the first side;
- a wiring laminate portion located on the first surface, extending along the first side of the first surface, and comprising a second surface extending along the second side; and
- a peripheral wall portion, together with the wiring laminate portion, surrounding the first surface, in which the wiring laminate portion comprises
- a plurality of insulation layers laminated in a layered structure,
- at least two first wiring conductors located on different insulation layers of the plurality of insulation layers, and
- a first interlayer conductor located on the second surface and coupling the at least two first wiring conductors to each other.

Advantageous Effect

The present disclosure enables more appropriate coupling between different layers in a semiconductor package.

DESCRIPTION OF EMBODIMENTS

Hereinafter, an embodiment will be described with reference to the drawings.

Figure 1:
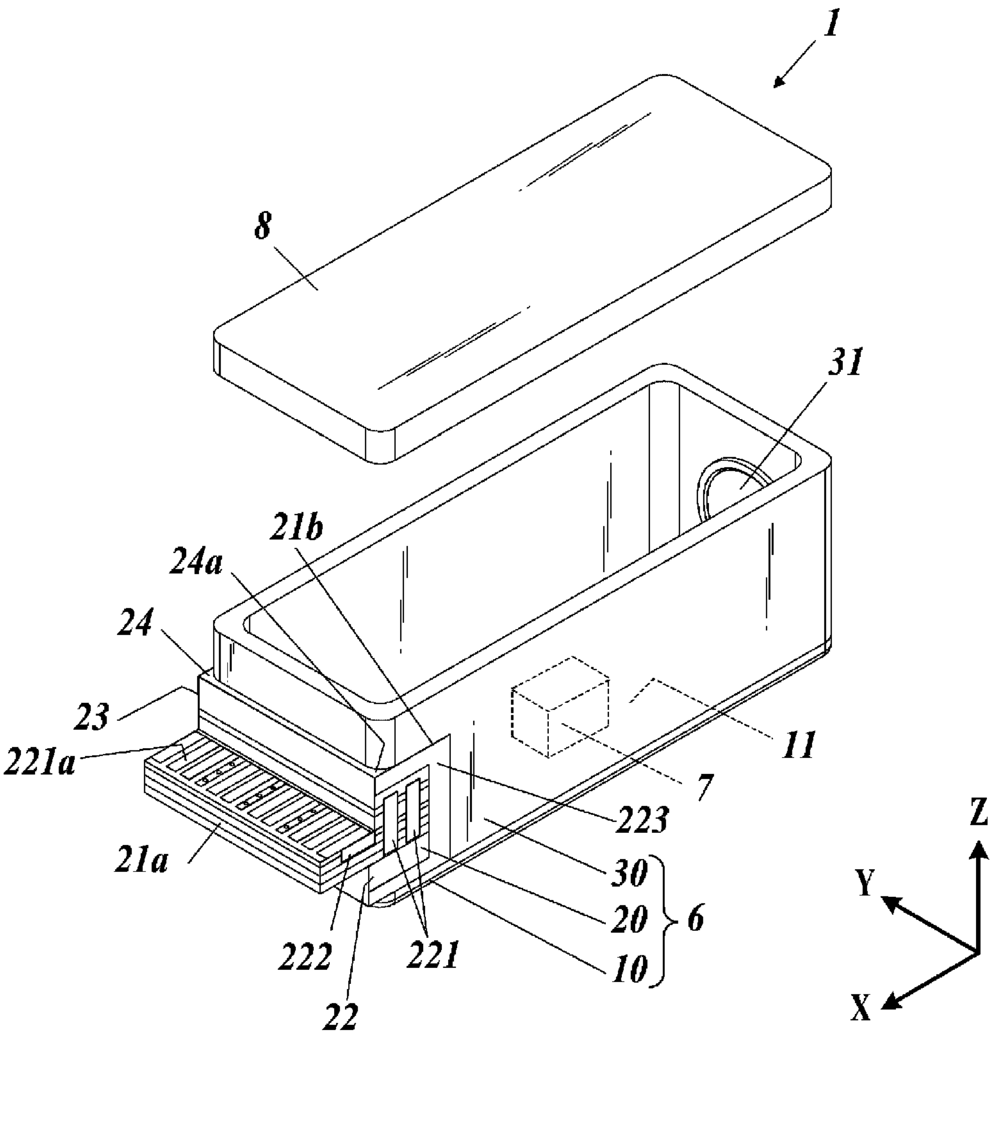
FIG. 1 is an overall perspective view of a semiconductor electronic device with a lid removed.

FIG. 1 is an overall perspective view of a semiconductor electronic device 1 of the present embodiment with a lid 8 removed.

The semiconductor electronic device 1 includes a semiconductor package 6, an electronic component 7, and the lid 8.

The semiconductor package 6 includes a substrate 10 (base), a wiring laminate 20 (wiring laminate portion), and a wall 30 (peripheral wall portion). The semiconductor package 6 may include a fixture or the like that is used for fixing the semiconductor package 6 to an external substrate or the like.

The substrate 10 includes an upper surface 11 (a first surface) which is a +Z side surface, and the wiring laminate 20 is located along a side (a first side, which in this case is the side located on the +X side and extending in the Y direction) of the upper surface 11. The wiring laminate 20 and the wall 30 form a frame-shaped housing that annularly surrounds the upper surface 11. The substrate 10 is approximately a rectangle in plan view in the Z direction (including ones with the corners rounded or chamfered) but is not limited to this shape.

The wiring laminate 20 includes a plurality of insulation layers laminated in a layered structure, and wiring conductors (first wiring conductors) such as signal lines, ground lines, and power supply lines are located on the upper surface of each insulation layer (at least two layers). The wiring laminate 20 is composed of a protruding portion **21*a* which is part of the insulation layers continuous in the up-down direction (Z direction) and protruding outward (in the +X direction) from the first side of the upper surface 11 (the substrate 10) in plan view and an inner portion 21*b* which is the portion other than the protruding portion 21*a* and located inside (on the −X side) of the first side. Coupling terminals (not illustrated) are located on an upper surface 211*a* (first upper surface) and the lower surface of the protruding portion 21*a* and are coupled to external wiring or the like. The two surfaces extending along the sides (second sides, which in this case are two sides extending in the X direction) of the upper surface 11, coupled to the first side are referred to as side surfaces 22 and 23 (second surfaces). Part of an upper surface 24 (second upper surface) of the inner portion 21*b* is joined to the wall 30. Part of the upper surface 24 is located outside (on the +X side) of the wall 30. A conductor surface 24*a* (second conductor) may be located on the upper surface 24. The conductor surface 24*a* is coupled to conductors 223 (first conductors) located at the boundaries between the side surfaces 22 and 23 and the wall 30**.

The wall 30 is located along the outer edges of the substrate 10 in plan view and has an annular shape surrounding the upper surface 11. The portion of the wall 30 overlapping the wiring laminate 20 in plan view is joined to the upper surface of the wiring laminate 20, and the portion of the wall 30 not overlapping the wiring laminate 20 is joined to the substrate 10. The height of the upper surface of the wall 30 is uniform in this case, but the present disclosure is not limited to this configuration. The semiconductor package 6 has a box shape having a recess with an open top, the bottom surface of which is the upper surface 11 of the substrate 10, the upper surface 11 being surrounded along its periphery by the wiring laminate 20 and the wall 30.

The wall 30 may have an opening 31 in a face that is one of the side surfaces of the semiconductor package 6 and is different from the face in which the wiring laminate 20 (the first side of the upper surface 11) is located. For example, in the case in which the electronic component 7 includes an optical component such as a photodiode or a laser diode, light can pass through the opening 31. The opening 31 may have a partition made of a light transmission member such as glass or a transparent resin and separating the inside and the outside of the semiconductor package 6.

The wiring laminate 20 and the wall 30 are formed by defining their three-dimensional shapes and may be, for example, members obtained by preparing a slurry containing the powder of a material substance (for example, aluminum oxide, silicon oxide, and the like) mixed with an organic binder and a solvent, forming the slurry into sheets, laminating a plurality of insulation sheets (ceramic green sheets), and pressing and firing the laminate. If necessary, processing such as cutting and stamping may be added as appropriate. To manufacture the wiring laminate 20, for example, a metal paste is prepared by mixing a conductor metal, a binder, and an organic solvent described above. When the insulation sheets described above are laminated, the metal paste is applied onto each insulation sheet by screen printing or the like. The metal paste is laminated together with plain insulation sheets and subjected to pressing and firing as described above.

The upper surface of the wall 30 may have a metallized layer. This configuration would improve the joining strength between the wall 30 and the lid 8. The metallized layer may be formed by application and firing, plating, or the like.

The wall 30 may be a member separate from the wiring laminate 20 and may be made of, for example, a metal such as FeNiCo.

The lid 8 is joined to the upper surface of the wall 30 and covers the upper surface of the recess described above. The wall 30 is a conductor which is, for example, a metal containing iron, copper, nickel, chromium, cobalt, molybdenum, or tungsten, or an alloy of some of these.

As described above, the wiring laminate 20 includes wiring conductors for transmitting signals or the like, on some or all of the upper surfaces (front surfaces) of the plurality of insulation layers. These wiring conductors can include signal lines, ground lines, and power supply lines. The path (electrical path) of each signal or power supply, composed of one or more wiring conductors couples the inside and the outside of the recess of the semiconductor package 6.

The electronic component 7 is located on the upper surface 11 of the substrate 10 and sits within the recess. One end of each electrical path inside of the semiconductor package 6 is coupled to a terminal of the electronic component 7 with a bonding wire or the like (not illustrated), and one end of the electrical path (the end opposite to the above one end) outside of the semiconductor package 6 is coupled to an external substrate or the like with a coupling terminal (not illustrated) interposed therebetween, which enables transmission and reception of signals, supply of power, and the like.

As described later, each of the side surfaces 22 and 23 of the wiring laminate 20 has interlayer conductors 221 (first interlayer conductors) and an interlayer conductor 222 (second interlayer conductor) which couple wiring conductors on different insulation layers, for example.

A conductor 223 (a metallized layer, a first conductor) is located along the outer edges of each of the side surfaces 22 and 23, the outer edges being in contact with the substrate 10 or the wall 30. When the wiring laminate 20 is joined to the substrate 10 and the wall 30, the soldering material used for joining flows moderately along the conductor 223, thereby avoiding an excess amount of the soldering material hardening and remaining on the joint surfaces. This makes it less likely for cracks to occur when a stress is exerted on the semiconductor package 6.

The following describes electrical paths located on the insulation layers of the wiring laminate 20.

FIGS. 2A to 4B are diagrams for explaining conductor portions of six insulation layers 201 to 206. FIG. 5 is a diagram for explaining the back surface of the lowermost insulation layer 206 of the six insulation layers 201 to 206. FIGS. 2A to 5 are all transparent plan views from above the upper surface. Note that the number of insulation layers in the embodiment may be seven or more.

Figure 2A:
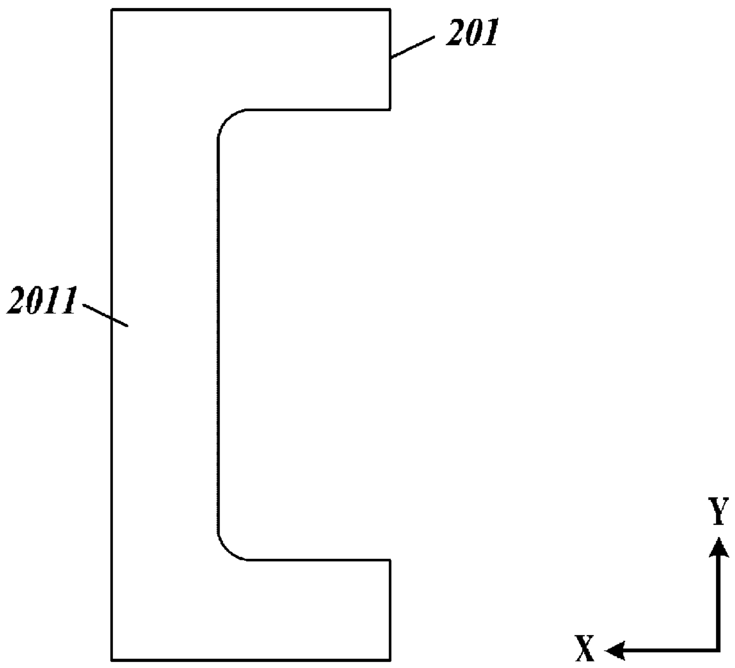
FIG. 2A is a diagram for explaining a conductor portion on an insulation layer.

FIG. 2A illustrates the upper surface of the uppermost insulation layer 201. A conductor surface 2011 extends over the entire upper surface of the insulation layer 201. The wall 30 is joined to this conductor surface 2011 with a soldering material or the like.

Figure 2B:
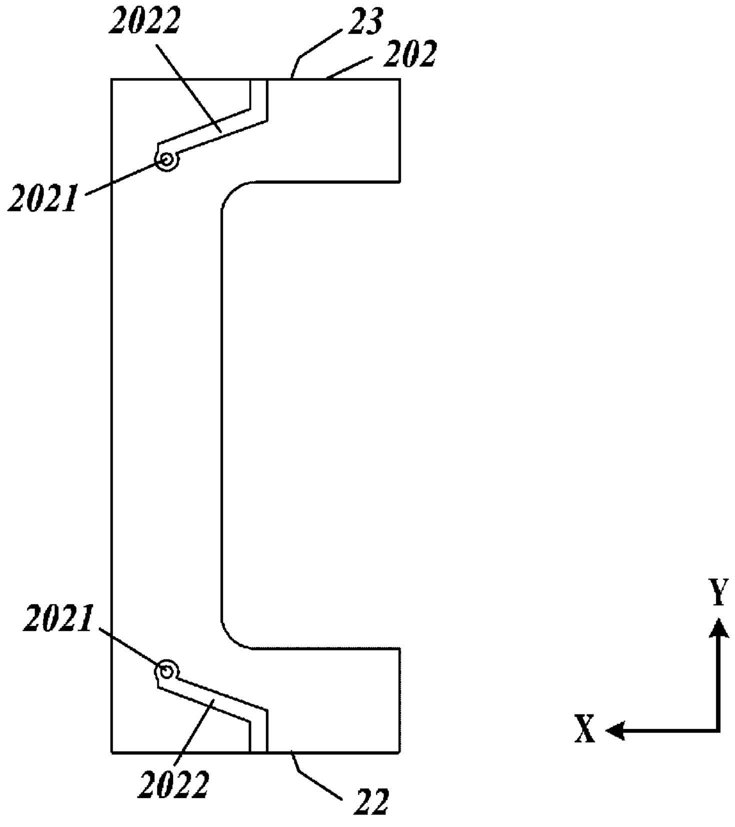
FIG. 2B is a diagram for explaining conductor portions on an insulation layer.

FIG. 2B illustrates the upper surface of the insulation layer 202 which is the second layer from the top among the six layers. The insulation layer 202 has pads 2021 coupled to via hole conductors inside of via holes extending through the insulation layer 201 and coupled to via hole conductors inside of via holes extending through the insulation layer 202, and signal lines 2022 extending from the pads 2021 to the side surfaces 22 and 23. Specifically, the signal lines 2022 are electrically continuous with pads 2034 through via hole conductors (see FIG. 3A). Here, for the convenience of explanation, only the pair of pads 2021 and the pair of pads 2034 are illustrated, but the present disclosure is not limited to this configuration. Three or more pads 2021 and three or more pads 2034 may be arranged in an appropriate positional relationship.

The insulation layers 201 and 202 have cut portions (recesses) on the right side (the −X side) in each figure.

Figure 3A:
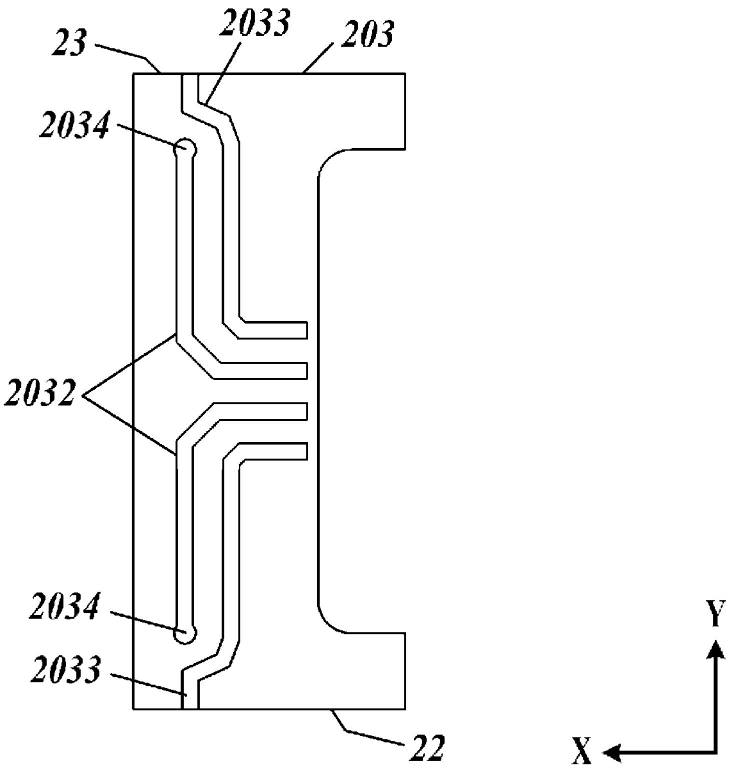
FIG. 3A is a diagram for explaining conductor portions on an insulation layer.

FIG. 3A illustrates the upper surface of the insulation layer 203 which is the third layer from the top among the six layers. Here, FIG. 3A illustrates a pair of signal lines 2032 and a pair of power supply lines 2033, and pads 2034. The depth (the width in the X direction) of the cut portion of the insulation layer 203 is less than those of the cut portions of the insulation layers 201 and 202, and ends (on the upper surface of the insulation layer 203) of the power supply lines 2033 and the signal lines 2032 located near an edge of the cut portion are exposed inside of the cut portions of the insulation layers 201 and 202 described above.

The power supply lines 2033 are continuous with the other ends located on the side surfaces 22 and 23, and the signal lines 2032 are continuous with the pads 2034. The pads 2034 overlap the pads 2021 in transparent plan view, and thus the pads 2034 are electrically coupled to the pads 2021 with via hole conductors inside of via holes extending through the insulation layer 202 interposed therebetween.

Exposed portions near the ends in the −X direction of the power supply lines 2033 and the signal lines 2032 are coupled to the electronic component 7 with bonding wires or the like inside of the semiconductor package 6, and thereby, power is supplied to the electronic component 7 at a specified voltage (including the ground voltage). Although here, the power supply lines 2033 and the signal lines 2032 are illustrated, these lines may be transmission lines for direct-current signals, signals switched at a low frequency (the low frequency denotes one that does not require consideration of impedance matching, as described above), or the like (these lines are collectively referred to as wiring conductors).

Figure 3B:
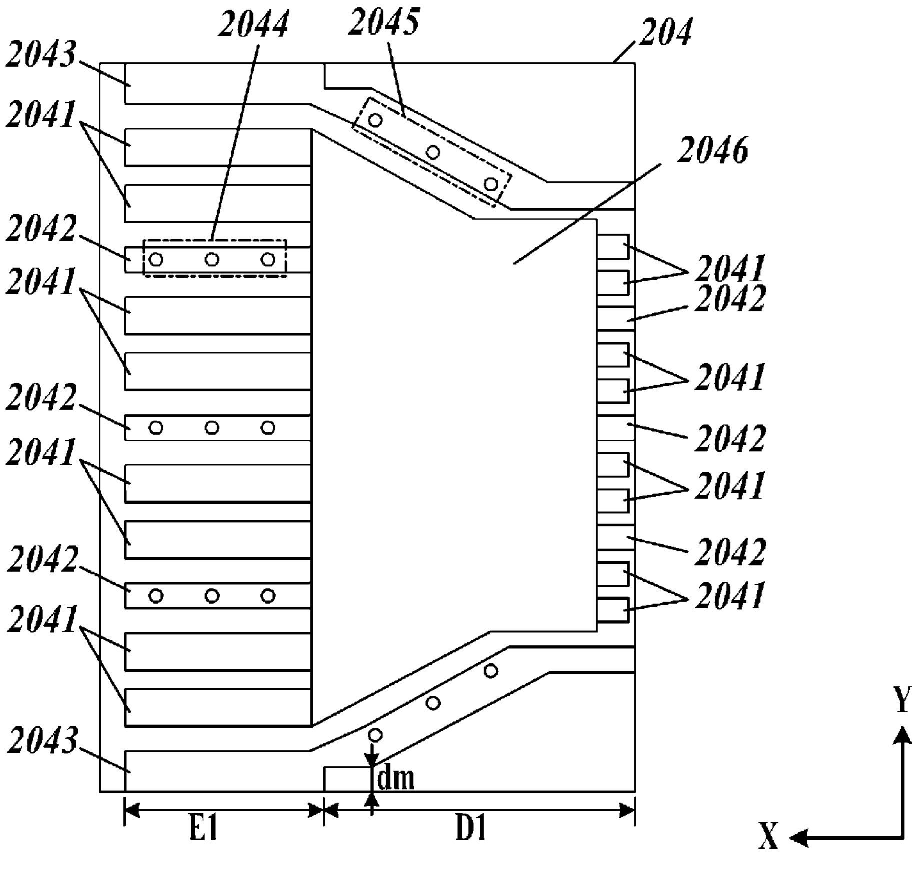
FIG. 3B is a diagram for explaining conductor portions on an insulation layer.

FIG. 3B illustrates the upper surface of the insulation layer 204 which is the fourth layer from the top among the six layers. The left side (the +X side) in the figure of the insulation layer 204 is the upper surface of the protruding portion 21*a* and is thus exposed to the outside of the semiconductor package 6. On the exposed portion, ends of signal lines 2041 and ground conductors 2042 and 2043 (grounding conductors) are located side by side. In this case, the signal lines 2041 are paired, and each pair serves as differential lines. The ground conductors 2042 (the ground conductors 2043 in some cases) are located on either side (in the +Y directions) of each pair of differential lines. Coupling terminals (extension terminals) (not illustrated) are joined to these ends of the signal lines 2041, and the coupling terminals are coupled to external signal lines or the like. These signal lines 2041 and ground conductors 2042 and 2043 in FIG. 3B are illustrated to be enlarged for the convenience of explanation. The sizes, gaps, and the number of lines may be determined appropriately in accordance with the number of signals, the size of the semiconductor package 6, and other factors.

The signal lines 2041 and the ground conductors 2042 pass under a cover layer 2046 and extend to the right side (the −X side) of the figure. Since the insulation layer 204 does not include a cut portion, the right-side (−X side) ends of the signal lines 2041 and the ground conductors 2042 and 2043 are exposed in the inside (the recess) of the semiconductor package 6 inside of the cut portion of the insulation layer 203. The cover layer 2046 is, for example, an insulating thin film made of alumina or the like. The right-side ends of the signal lines 2041 are coupled to the electronic component 7 with bonding wires (not illustrated) or the like, and signals are transmitted between the signal lines 2041 and the electronic component 7. Signals to be transmitted are RF signals, which may be signals having a frequency of 1 MHz or more or, in particular, may be signals having a frequency in a GHz band.

Each of the ground conductors 2042 is in contact with via hole conductors 2044. The via hole conductors 2044 are electrically continuous with a ground conductor surface 2051 on the insulation layer 205 through via holes extending through the insulation layer 204. Via hole conductors 2045 may be located in the portion that is not the protruding portion 21*a* (the portion other than the protruding portion 21*a*) in plan view. An insulation layer (not illustrated) may be located between the insulation layers 203 and 204, and the via hole conductors 2045 may be coupled to a ground conductor surface on this insulation layer with via holes extending through this insulation layer interposed therebetween.

The ground conductors 2043 are located at both ends in the Y direction in the protruding portion 21*a*, and the ends of the ground conductors 2043 are exposed to the side surfaces 22 and 23. The exposed portions E1 (first areas) are joined (coupled) to the interlayer conductors 222 located on the side surfaces. The portions other than the exposed portions E1 (adjacent portions D1 (second areas) adjacent to the interlayer conductors 221) are located away from the side surfaces 22 and 23 and, in this case, located next (adjacent) to and a distance dm or more away from the interlayer conductors 221. In this configuration, an edge (a side) of the ground conductor 2043 extends in the direction parallel to the first side (the direction perpendicular to the side surfaces 22 and 23) between the exposed portion E1 and the adjacent portion D1 and couples the adjacent portion D1 and the side surface 22.

Figure 4A:
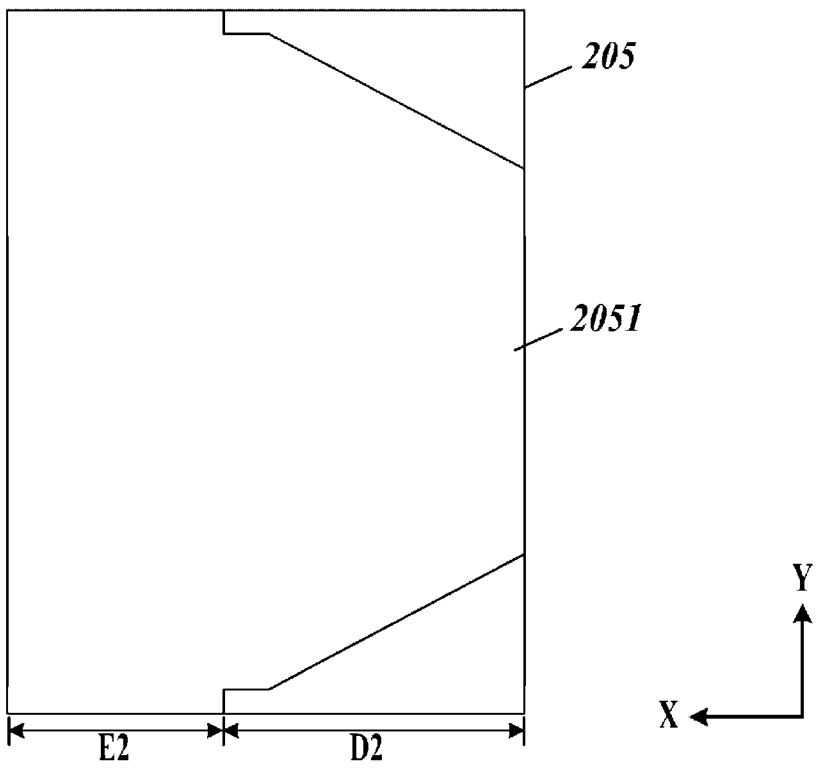
FIG. 4A is a diagram for explaining a conductor portion on an insulation layer.
Figure 5:
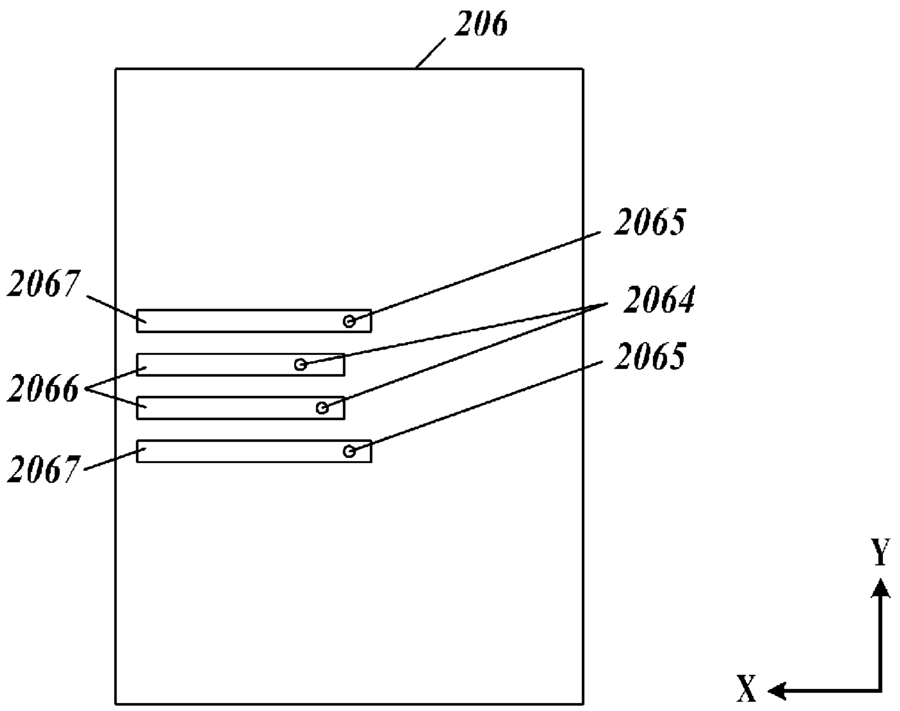
FIG. 5 is a diagram for explaining conductor portions on the lower surface of an insulation layer.

FIG. 4A illustrates the upper surface of the insulation layer 205 which is the fifth layer from the top among the six layers. The ground conductor surface 2051 (interlayer grounding conductor) extends over the insulation layer 205. The ground conductor surface 2051 extends over an exposed portion E2 and an adjacent portion D2 (in other words, the area of the protruding portion 21*a* and the area other than the protruding portion 21*a* in transparent plan view) so as to cover all the area of the signal lines 2041 on the insulation layer 204 in transparent plan view. As with the ground conductors 2043 of the insulation layer 204, the exposed portion E2 of the ground conductor surface 2051 is exposed to the side surfaces 22 and 23, and the adjacent portion D2 of the ground conductor surface 2051 is a specified distance (distance dm) away from the side surfaces 22 and 23. The sides at the boundary between these areas extend parallel to the first side (in the direction perpendicular to the side surfaces 22 and 23). The position of these sides approximately overlap the edges of the ground conductors 2042 located between the exposed portions E1 and the adjacent portions D1 on the insulation layer 204 in FIG. 3B in transparent plan view.

As described above, the wiring laminate 20 is shaped by cutting, punching, or the like after fabrication. Inevitably, the position of cutting or punching has physically minute variation. However, since the boundaries between the exposed portions E1 and E2 and the adjacent portions D1 and D2 are parallel to the first side (perpendicular to the side surfaces 22 and 23) as described above, some variation will not cause positional deviations of the boundaries in the X direction. Accordingly, the exposed portions E1 and E2 are less likely to be larger than or smaller than the necessary range, and in particular, occurrence of an unnecessary exposed portion that would cause an unintentional short circuit or the like can be avoided.

Figure 4B:
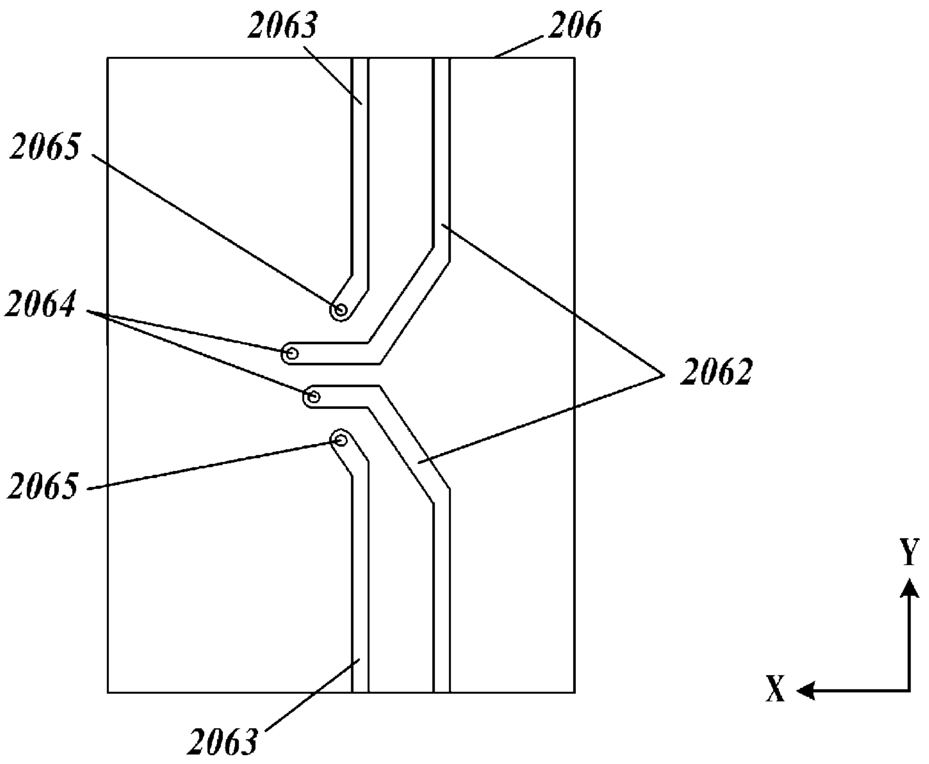
FIG. 4B is a diagram for explaining conductor portions on an insulation layer.

FIG. 4B illustrates the upper surface of the insulation layer 206 which is the lowermost layer among the six layers. The lower surface (the bottom surface) of this insulation layer 206 serves as the lower surface of the protruding portion 21*a*. Signal lines 2062 and power supply lines 2063 are located on the insulation layer 206.

One end of each signal line 2062 is exposed to the side surface 22 or 23 and is in contact with one of the interlayer conductors 221. The other end opposite to the one end of each signal line 2062 is electrically continuous with a via hole conductor 2064 extending through the insulation layer 206 and is coupled to a wiring conductor 2066 illustrated in FIG. 5 with the via hole conductor 2064 interposed therebetween. The wiring conductors 2066 are exposed to the lower surface of the protruding portion 21*a* and are coupled to external wiring or the like with coupling terminals or the like interposed therebetween.

One end of each power supply line 2063 is exposed to the side surface 22 or 23 and is in contact with one of the interlayer conductors 221 different from the one in contact with the signal line 2062. The other end opposite to the one end of each power supply line 2063 is electrically continuous with a via hole conductor 2065 extending through the insulation layer 206 and is coupled to a wiring conductor

2067 illustrated in FIG. 5 with the via hole conductor 2065 interposed therebetween. The wiring conductors 2067 are exposed to the lower surface of the protruding portion 21*a* and are coupled to external wiring or the like with coupling terminals or the like interposed therebetween.

Figure 6:
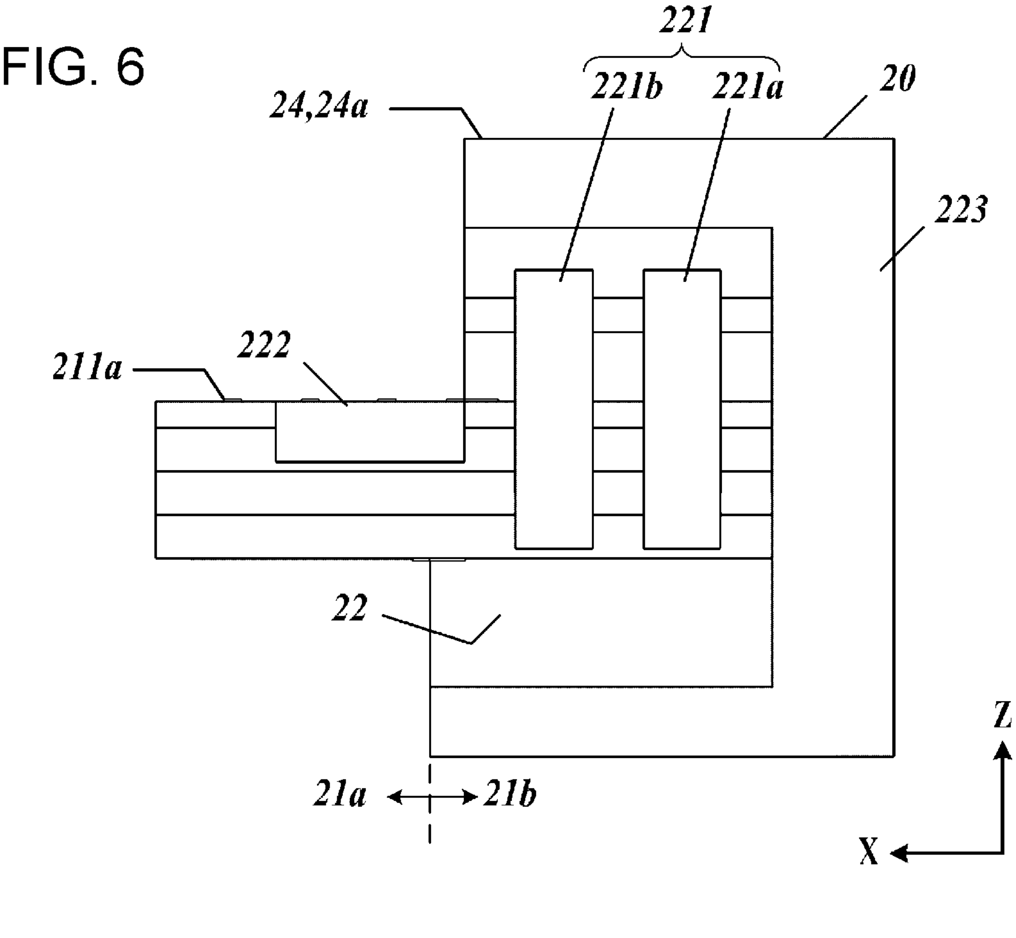
FIG. 6 is a diagram illustrating a side surface of a wiring laminate.

FIG. 6 is a side view of the side surface 22. Note that since the side surface 23 in the present embodiment is the same as the side surface 22 in transparent plan view from the side surfaced 22 side, description thereof is omitted.

The interlayer conductors 221 include planar interlayer conductors 221*a* and 221*b* located in the area surrounded by the conductor 223 on each side surface of the inner portion 21*b*. The interlayer conductor 221*a* couples the signal lines 2022 and 2062 on the different insulation layers 202 and 206. The interlayer conductor 221*b* couples the power supply lines 2033 and 2063 on the different insulation layers 203 and 206. Each interlayer conductor 221 may be located in the inner surface of a recess having a semi cylindrical shape or the like. The interlayer conductor 222 is located outside (on the +X side) of the interlayer conductors 221 and couples, on the side surface of the protruding portion 21*a*, the ground conductor 2043 (in this case, the ground conductor on the upper surface of the protruding portion 21*a*, first grounding conductor) and the ground conductor surface 2051 on the different insulation layers 204 and 205. Here, the length of the interlayer conductor 222 in the X direction may be shorter than the length of the ground conductor 2043 in the X direction (the length E1 in FIG. 3B). Parts of electrical paths may be exposed on the surfaces of the semiconductor package 6 if the paths are for one type of the following: paths the purpose of which are not for transmitting voltage changes such as ground lines and power supply lines; paths for direct current signals in which the voltage does not change; and paths for low-frequency alternating current signals in which the frequency of transmission signals is not so high that impedance matching is necessary, and that do not emit electromagnetic waves or the like from exposed portions, for example, signals with frequencies of 1 MHz or less. Conventional power supply lines using via hole conductors have restrictions or the like such as minimum necessary distances (clearances) and positional relationships with surrounding signal lines or the like in an insulation layer, and this limits downsizing. However, the electrical paths exposed to the side surfaces 22 and 23 as described above make it possible to easily define electrical paths by detouring around, in particular, the upper surface of the insulation layer 204 having a large number of signal lines 2041.

The upper surface 24 of the inner portion 21*b* has the conductor surface 24*a* coupled to the conductors 223 as described above.

[Variations]

Figure 7A:
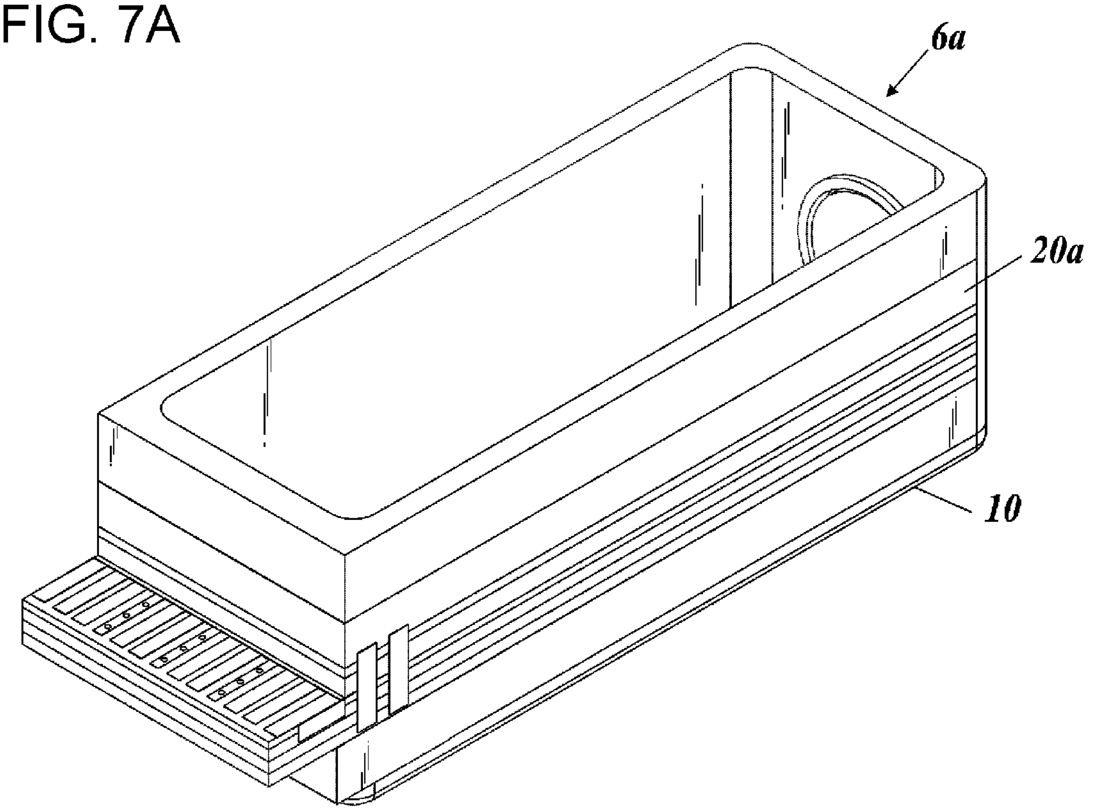
FIG. 7A is a perspective view of a semiconductor package of variation 1.
Figure 7B:
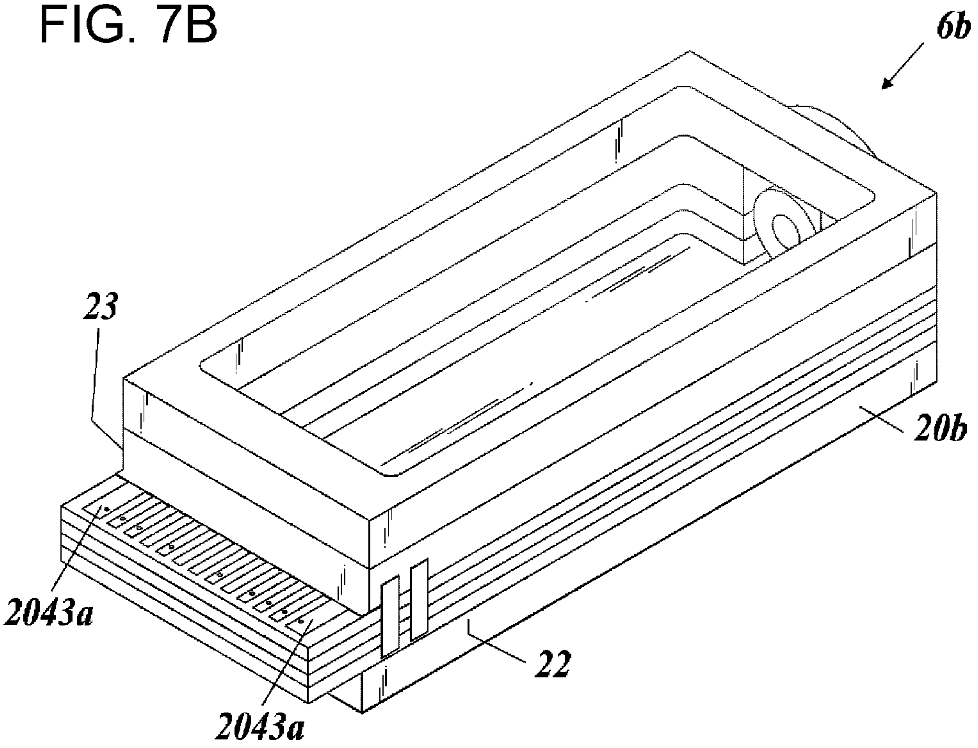
FIG. 7B is a perspective view of a semiconductor package of variation 2.

FIGS. 7A and 7B are perspective views of variations of the semiconductor package 6.

FIG. 7A illustrates a semiconductor package 6*a* of variation 1. In the semiconductor package 6*a*, a wiring laminate 20 and a wall 30 compose a laminate 20*a* having an integrated structure. In this case, each of the laminated insulation layers has an annular structure. This configuration eliminates the need for the conductors 223 located on the edges of the wiring laminate 20 and along its surface joined to the wall 30. The structure of the portion (wiring laminate portion) corresponding to the other part of the wiring laminate 20 is the same as that of the embodiment described above, and hence description thereof is omitted.

FIG. 7B illustrates a semiconductor package 6*b* of variation 2. In the semiconductor package 6*b*, a substrate 10, a wiring laminate 20, and a wall 30 are all included in a laminate 20*b* having an integrated structure. In this case, the insulation layer corresponding to the substrate 10 has a plate shape, and the other insulation layers have annular shapes as in the laminate 20*a* described above. Since the semiconductor package 6*b* is not a combination of a plurality of members, the conductors 223 are not necessary.

In the portion corresponding to the wiring laminate 20 (wiring laminate portion) in variation 2, ground conductors 2043*a* are not in contact with side surfaces 22 and 23, and hence, the laminate 20*b* does not have interlayer conductors 222 on the side surfaces. The other configuration and structure are the same as those of the embodiment described above; hence, description thereof is omitted.

As in these configurations, the wiring laminate 20 need not be a separate member and may be part of a laminate formed integrally with the wall 30 and/or the substrate 10.

As described above, the semiconductor package 6 of the present embodiment includes: the substrate 10 including the upper surface 11 including the first side and the second sides coupled to the first side; the wiring laminate 20 located on the upper surface 11 and along the first side of the upper surface 11 and including the side surfaces 22 and 23 extending along the second sides; and the wall 30, together with the wiring laminate 20, surrounding the upper surface 11. The wiring laminate 20 includes the plurality of insulation layers 201 to 206 laminated in a layered structure, at least two first wiring conductors such as signal lines 2022 and 2062 and power supply lines 2033 and 2063 located on different insulation layers (202, 203, 206, and the like) of the plurality of insulation layers 201 to 206, and the interlayer conductors 221 located on the side surfaces 22 and 23 and coupling the at least two first wiring conductors described above.

This semiconductor package 6 enables control signals, ground voltages, and supplied power, which are conventionally coupled between different insulation layers with via holes interposed therebetween, to be transmitted through the side surfaces of the semiconductor package. This configuration eliminates the need for managing to arrange via holes at necessary intervals when the number of signal lines is large and enables more appropriate coupling between different insulation layers. Accordingly, this configuration can achieve a smaller size despite the number of signal lines.

The interlayer conductors 221 are configured to transmit a low-frequency alternating current signal or a direct current signal such as power supply. Such signals, even if part of the electrical path is exposed to the outside of the insulation layers, do not cause a problem such as impedance mismatching, for example, at the boundary between an exposed portion and a non-exposed portion. Hence, the interlayer conductors 221 can be used for these signals without any problem.

The electrical paths including the interlayer conductors 221 (first interlayer conductors) may be grounding conductors. Also in this case, the electrical paths may be exposed to the outside of the insulation layers and hence can appropriately couple the ground conductors on different insulation layers.

The wiring laminate 20 may include two interlayer conductors 221*a* and 221*b* extending side by side on each of the side surfaces 22 and 23. This configuration save a space to transmit a plurality of kinds of signals and voltages.

The wiring laminate 20 may have recesses located on each of the side surfaces 22 and 23, and the interlayer conductors 221 may be located in the recesses. This configuration enables each interlayer conductor 221 to have a larger area despite a small width in the X direction.

The wiring laminate 20 includes the protruding portion 21*a* protruding outward from the first side and including the upper surface 211*a*, the inner portion 21*b* located inside (on the −X side) of the first side, the ground conductors 2043 located on the upper surface 211*a* of the protruding portion 21*a*, the ground conductor surface 2051 located between insulation layers and extending over the protruding portion 21*a* and the inner portion 21*b*, and the interlayer conductor 222 located on each of the side surfaces 22 and 23 and coupling the corresponding ground conductor 2043 and the ground conductor surface 2051. Since a ground conductor is provided between signal lines in many cases in the protruding portion 21*a* having coupling terminals for signal lines, the protruding portion 21*a* often does not have enough space due to downsizing. Since the ground conductors on both ends are coupled to another layer with the outside surfaces interposed therebetween, the number of via holes can be smaller. Accordingly, an appropriate ground surface can be provided, thereby reducing loss of signals while avoiding an increase in size.

The interlayer conductors 222 are located outside (on +X side) of the interlayer conductors 221 on the side surfaces 22 and 23. In other words, since the interlayer conductors 222 coupling conductors on layers including the upper surface 211*a* of the protruding portion 21*a* to a conductor on another layer are positioned on the protruding portion 21*a* side, the plurality of interlayer conductors can be efficiently arranged.

The length in the X direction of the interlayer conductor 222 on each of the side surfaces 22 and 23 may be shorter than the length in the X direction of each ground conductor 2043 on the upper surface 211*a*. In other words, as long as the interlayer conductors 222 have a required length, all the lengths of the ground conductors 2043 need not be in contact with the interlayer conductors 222, and the conductor member need not be larger than necessary.

At least one of the set of ground conductors 2043 and the ground conductor surface 2051 has, in transparent plan view, the exposed portion E1 coupled to the side surfaces 22 and 23, the adjacent portion D1 located away from the side surfaces 22 and 23 and being adjacent to and a distance dm or more away from the interlayer conductors 221, and the side coupling the exposed portion E1 and the adjacent portion D1 and being parallel to the first side. In other words, since the adjacent portions D1 are away from the side surfaces 22 and 23, the adjacent portions D1 will not be cut in production. In addition, since the edge of the portion coupling the adjacent portion D1 and the side surface 22 or 23 is perpendicular to the side surface 22 or 23 and is not oblique, even if the cut position has a positional deviation, the areas of the ground conductors 2043 and the ground conductor surface 2051 exposed to the side surface 22 or 23 do not change. In a case in which the side surfaces 22 and 23 have the interlayer conductors 221 and 222, a positional deviation of the exposed surfaces can cause not only a positional deviation in the coupling areas but also unintentional coupling to another portion, leading to a short circuit or the like. Thus, since the areas of the ground conductors are determined as described above, positioning can be easily performed without an improvement in the accuracy of cutting or the like in production relative to conventional ones, which provides appropriate electrical paths.

The wiring laminate 20 includes the conductors 223 extending along the outer edges of the side surfaces 22 and 23, the outer edges being in contact with at least the substrate 10 and the wall 30. When the wiring laminate 20 is joined to the substrate 10 and the wall 30, the soldering material used for joining flows moderately along the conductors 223, thereby avoiding an excess amount of the soldering material hardening and remaining on the joint surfaces. This makes it less likely for cracks to occur when a stress is exerted on the semiconductor package 6.

The wiring laminate 20 includes the upper surface 24 coupled to the side surfaces 22 and 23 and the conductor surface 24*a* located on the upper surface 24, and the conductor surface 24*a* may be coupled to the conductors 223. With this configuration, the wiring laminate 20 can be grounded more stably.

The semiconductor electronic device 1 of the present embodiment includes: the semiconductor package 6 described above; and the electronic component 7 located on the upper surface 11 of the substrate 10. This semiconductor electronic device 1 enables appropriate coupling of electrical paths such as ground lines and power supply lines and appropriate operation of the electronic component 7.

Note that the above embodiment is a mere example and hence can be changed in various ways.

For example, although description of the above embodiment assumes that the same interlayer conductors 221 and 222 are located on both of the side surfaces 22 and 23 and at the same positions in transparent plan view in the same direction (located symmetrically with respect to the plane located in the middle between the side surfaces 22 and 23), the present disclosure is not limited to this configuration. The side surfaces 22 and 23 may have interlayer conductors at different positions with different sizes and shapes or may have a different number of interlayer conductors in accordance with wiring patterns or the like.

In a case in which a plurality of interlayer conductors is used for different purposes, specifically, a plurality of purposes out of ground lines, power supply lines, signal lines for low-frequency signals, and the like, and these lines are mixed, the positional relationship may be adjusted between these interlayer conductors.

The semiconductor package 6 need not necessarily include the interlayer conductors 222. In a case in which the protruding portion 21*a* has a sufficient space, via hole conductors can be used conventionally for coupling between layers instead of the interlayer conductors 222.

Although the above embodiment has the interlayer conductors 221 coupling layers on both sides of the fourth insulation layer having RF signal lines, the present disclosure is not limited to this configuration. The interlayer conductors may couple any different layers.

The interlayer conductors are not limited to rectangular shapes extending in the Z direction. Interlayer conductors may extend obliquely on the side surfaces 22 and 23 or may have shapes of curved lines or zigzag lines. In addition, the thicknesses (in the direction perpendicular to the Z direction) of interlayer conductors are not limited to being uniform.

Although description of the above embodiment assumes that the lid 8 is a member separate from the semiconductor package 6, the semiconductor package 6 may include the lid 8.

The method of fabricating the semiconductor package 6 is not limited to ones using insulation sheets as described above. The semiconductor package 6 may be fabricated by another method.

The semiconductor package 6 is not limited to ones including the protruding portion 21*a* and not limited to ones in which the protruding portion 21*a* is a protrusion of insulation layers located in the middle. The protruding portion 21*a* may include the uppermost or the lowermost insulation layer. The protruding portion 21*a* is not limited to ones protruding across the entire length of the first side. The protruding portion 21*a* may have a cut portion.

The semiconductor package 6 described above may be manufactured and sold separately from the electronic component 7. In this case, the lid 8 may be sold in a state of not being joined to the semiconductor package 6.

In addition, specific details of the configurations, materials, and structures illustrated in the above embodiment may be changed as appropriate within a scope not departing from the spirit of the present disclosure. The scope of the present invention includes the scope of the claims and the equivalents thereof.

INDUSTRIAL APPLICABILITY

The present disclosure is applicable to a semiconductor package and a semiconductor electronic device.

The invention claimed is:

1. A semiconductor package comprising:
a base comprising a first surface comprising a first side and a second side coupled to the first side;
a wiring laminate portion located on the first surface, extending along the first side of the first surface, and comprising a second surface extending along the second side; and
a peripheral wall portion, together with the wiring laminate portion, surrounding the first surface, wherein
the wiring laminate portion comprises
a plurality of insulation layers laminated in a layered structure,
at least two first wiring conductors located on different insulation layers of the plurality of insulation layers,
a protruding portion protruding outward from the first side and comprising a first upper surface, an inner portion located inside of the first side,
a first grounding conductor located on the first upper surface of the protruding portion, an interlayer grounding conductor located between the insulation layers and extending over the protruding portion and the inner portion, and
a first interlayer conductor located on the second surface and coupling the at least two first wiring conductors to each other.

2. The semiconductor package according to claim 1, wherein
the first interlayer conductor is a conductor for a low-frequency alternating current signal or a direct current signal.

3. The semiconductor package according to claim 1, wherein
the first interlayer conductor is a grounding conductor.

4. The semiconductor package according to claim 1, wherein
the wiring laminate portion comprises two first interlayer conductors extending side by side on the second surface.

5. The semiconductor package according to claim 1, wherein
the wiring laminate portion comprises a recess located in the second surface, and
the first interlayer conductor is located in the recess.

6. The semiconductor package according to claim 1, wherein
the wiring laminate portion comprises:
a second interlayer conductor located on the second surface and coupling the first grounding conductor and the interlayer grounding conductor.

7. The semiconductor package according to claim 6, wherein
the second interlayer conductor is located outside of the first interlayer conductor, on the second surface.

8. The semiconductor package according to claim 6, wherein
the second interlayer conductor on the second surface is shorter than the first grounding conductor on the first upper surface.

9. The semiconductor package according to claim 6, wherein
at least one of the first grounding conductor or the interlayer grounding conductor comprises, in transparent plan view, a first area couped to the second surface, a second area located away from the second surface and adjacent to the first interlayer conductor, and a side coupling the first area and the second area and being parallel to the first side.

10. The semiconductor package according to claim 1, wherein
the wiring laminate portion comprises a first conductor extending along an outer edge of the second surface, the outer edge being in contact with at least either the base or the peripheral wall portion.

11. The semiconductor package according to claim 10, wherein
the wiring laminate portion comprises a second upper surface coupled to the second surface and a second conductor located on the second upper surface, and
the second conductor is coupled to the first conductor.

12. A semiconductor electronic device comprising:
the semiconductor package according to claim 1; and
an electronic component located on the first surface.

* * * * *